(12) United States Patent
Lee et al.

(10) Patent No.: US 9,865,341 B2
(45) Date of Patent: Jan. 9, 2018

(54) ELECTRONIC DEVICE

(71) Applicant: SK hynix Inc., Icheon (KR)

(72) Inventors: Hyung-Dong Lee, Icheon (KR); Soo-Gil Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 135 days.

(21) Appl. No.: 14/877,807

(22) Filed: Oct. 7, 2015

(65) Prior Publication Data

US 2016/0307625 A1 Oct. 20, 2016

(30) Foreign Application Priority Data

Apr. 14, 2015 (KR) ........................ 10-2015-0052414

(51) Int. Cl.
| | | |
|---|---|---|
| G11C 11/00 | (2006.01) | |
| G11C 13/00 | (2006.01) | |
| G06F 3/06 | (2006.01) | |
| G06F 12/0802 | (2016.01) | |
| G06F 13/40 | (2006.01) | |

(52) U.S. Cl.
CPC .......... *G11C 13/004* (2013.01); *G06F 3/0604* (2013.01); *G06F 3/0656* (2013.01); *G06F 3/0679* (2013.01); *G06F 12/0802* (2013.01); *G06F 13/4068* (2013.01); *G11C 13/0026* (2013.01); *G11C 13/0028* (2013.01); *G11C 13/0069* (2013.01); *G06F 2212/2024* (2013.01); *G06F 2212/222* (2013.01); *G11C 2013/0073* (2013.01); *G11C 2213/72* (2013.01); *G11C 2213/76* (2013.01)

(58) Field of Classification Search
CPC .............. G11C 13/004; G11C 13/0069; G11C 13/0026; G11C 13/0028; G11C 2213/76; G11C 2013/0073; G11C 2213/72; G06F 3/0604; G06F 3/0656; G06F 3/0679; G06F 12/0802; G06F 13/4068; G06F 2212/2024; G06F 2212/222

See application file for complete search history.

(56) References Cited

U.S. PATENT DOCUMENTS

| | | | |
|---|---|---|---|
| 2014/0010006 A1* | 1/2014 | Rao ..................... | G11C 11/16 365/171 |
| 2014/0071738 A1* | 3/2014 | Kim ..................... | G11C 29/832 365/158 |
| 2014/0177321 A1* | 6/2014 | Park ..................... | G11C 13/004 365/148 |

FOREIGN PATENT DOCUMENTS

| | | |
|---|---|---|
| KR | 10-0970383 B1 | 7/2010 |
| KR | 10-2014-0083475 A | 7/2014 |

* cited by examiner

*Primary Examiner* — Hien Nguyen

(57) ABSTRACT

An electronic device includes a semiconductor memory unit, which includes resistive memory cells; an access circuit to apply, during a write operation, a write voltage across a selected one of the resistive memory cells in a first or second direction; first switching units, each of which is disposed between the access circuit and a first end of a corresponding one of the resistive memory cells and turned on in response to a first voltage having a level higher than a predetermined level when the corresponding resistive memory cell is selected during the write operation; and second switching units, each of which is disposed between the access circuit and a second end of the corresponding resistive memory cell and turned on in response to a second voltage having a level equal to or lower than the predetermined level when the corresponding resistive memory cell is selected during the write operation.

32 Claims, 12 Drawing Sheets

ELECTRONIC DEVICE

CROSS-REFERENCE TO RELATED APPLICATIONS

The present application claims priority of Korean Patent Application No. 10-2015-0052414, entitled "ELECTRONIC DEVICE" and filed on Apr. 14, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which applies a proper reset voltage across a variable resistance element without a resistance deviation among variable resistance elements included in resistive memory cells.

Also, the disclosed technology in this patent document includes memory circuits or devices and their applications in electronic devices or systems and various implementations of an electronic device which is capable of preventing degradation in distribution of resistance values in a reset state when a reset voltage applied across variable resistance elements included in resistive memory cells is low, or a breakdown when the reset voltage is high.

In an embodiment, an electronic device may include a semiconductor memory unit.

The semiconductor memory unit may include: one or more resistive memory cells; an access circuit suitable for applying, during a write operation, a write voltage across a selected resistive memory cell among the resistive memory cells in a first or second direction; one or more first switching units, each of which is coupled to and disposed between the access circuit and a first end of a corresponding resistive memory cell among the resistive memory cells and turned on in response to a first voltage having a level higher than a predetermined level when the corresponding resistive memory cell is selected during the write operation; and one or more second switching units, each of which is coupled to and disposed between the access circuit and a second end of the corresponding resistive memory cell among the resistive memory cells and turned on in response to a second voltage having a level equal to or lower than the predetermined level when the corresponding resistive memory cell is selected during the write operation.

Each of the resistive memory cells may include: a variable resistance element having a high resistance state or low resistance state according to a logic value of data stored therein; and a selecting element coupled in series to the variable resistance element.

The full-turn-on level may be equal to the sum of a level of the write voltage, a level of a threshold voltage of the second switching unit, and a level of a threshold voltage of the selecting element.

The first switching unit may include one or more first transistors serially coupled to and disposed between the access circuit and the first end of the corresponding resistive memory cell, and wherein the second switching unit comprises one or more second transistors serially coupled to and disposed between the access circuit and the second end of the corresponding resistive memory cell.

The variable resistance element may be switched to the low resistance state when the write voltage is applied thereto in the first direction, and switched to the high resistance state when the write voltage is applied thereto in the second direction opposite to the first direction.

The second voltage may have a level equal to or higher than the sum of a reset level, a level of a threshold voltage of the second switching unit, and a level of a threshold voltage of the selecting element.

The reset level may include the minimum level required for switching the variable resistance element to the high resistance state.

The access circuit may apply a read voltage across the selected resistive memory cell in the first direction during a read operation.

The first and second switching units corresponding to the selected resistive memory cell may be turned on in response to the first voltage during the read operation.

When the write voltage is applied across the selected resistive memory cell in the first direction, the access circuit applies the write voltage to a first end of the selected resistive memory cell and applies a ground voltage to a second end of the selected resistive memory cell.

When the write voltage is applied across the selected resistive memory cell in the second direction, the access circuit applies the write voltage to the second end of the selected resistive memory cell and applies the ground voltage to the first end of the selected resistive memory cell.

The electronic device further comprising a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device further comprising a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In an embodiment, an electronic device may include a semiconductor memory unit.

The semiconductor memory unit may include: a cell array comprising a plurality of resistive memory cells arranged at intersections of a plurality of columns and a plurality of rows; an access circuit suitable for applying, during a write operation, a write voltage to a selected column among the plurality of columns and applying, during the write operation, a ground voltage to a selected row among the plurality of rows, or applying, during the write operation, the ground voltage to the selected column and applying the write voltage to the selected row; a column selection circuit comprising a plurality of first switching units, each of the plurality of first switching units being coupled to and disposed between the access circuit and a corresponding column among the plurality of columns and turned on in response to a first voltage when the corresponding column is selected during the write operation; and a row selection circuit comprising a plurality of second switching units, each of the plurality of second switching units being coupled to and disposed between the access circuit and a corresponding row among the plurality of rows and turned on in response to a second voltage when the corresponding row is selected during the write operation.

The first voltage have a level that is higher than a predetermined level, and the second voltage have a level that is equal to or lower than the predetermined level.

Each of the plurality of the resistive memory cells may include: a variable resistance element having a high resistance state or low resistance state according to a logic value of data stored therein; and a selecting element coupled in series to the variable resistance element.

The predetermined level may correspond to a full-turn-on level that is equal to the sum of a level of the write voltage, a level of a threshold voltage of the second switching unit, and a level of a threshold voltage of the selecting element.

Each of the first switching units may include one or more first transistors serially coupled to and disposed between the access circuit and a first end of a corresponding resistive memory cell.

Each of the second switching units may include one or more second transistors serially coupled to and disposed between the access circuit and a second end of the corresponding resistive memory cell.

The variable resistance element may be switched to the low resistance state when the write voltage is applied to the corresponding column among the plurality of columns and the ground voltage is applied to the corresponding row among the plurality of rows, and switched to the high resistance state when the ground voltage is applied to the corresponding column and the write voltage is applied to the corresponding row.

The second voltage may have a level equal to or higher than the sum of a reset level, a level of a threshold voltage of the second switching unit, and a level of a threshold voltage of the selecting element.

The reset level may correspond to a minimum level required for switching the variable resistance element to the high resistance state.

The access circuit may apply a read voltage to the selected column and applies the ground voltage to the selected row during a read operation.

The first switching unit corresponding to the selected column and the second switching unit corresponding to the selected row may be turned on in response to the first voltage during the read operation.

Each of the plurality of first switching units may include one or more first switching transistors coupled in series, each of the plurality of second switching units may include one or more second switching units coupled in series, the first voltage may control the one or more first switching transistors to operate in a linear region, and the second voltage may control the one or more second switching units to operate in the linear region when a variable resistance element included in a corresponding resistive memory cell is in a low resistance state, and control the one or more second switching units to operate in a saturation region when the variable resistance element included in the corresponding resistive memory cell is in a high resistance state.

The electronic device further comprising a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device further comprising a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

Each of the plurality of first switching units may include one or more first switching transistors coupled in series.

Each of the plurality of second switching units may include one or more second switching units coupled in series.

The first voltage may control the one or more first switching transistors to operate in a linear region.

The second voltage may control the one or more second switching units to operate in the linear region when a variable resistance element included in the resistive memory cell is in a low resistance state, and control the one or more second switching units to operate in a saturation region when the variable resistance element included in the resistive memory cell is in a high resistance state.

DETAILED DESCRIPTION

Various examples and implementations of the disclosed technology are described below in detail with reference to the accompanying drawings.

Figure 1A:
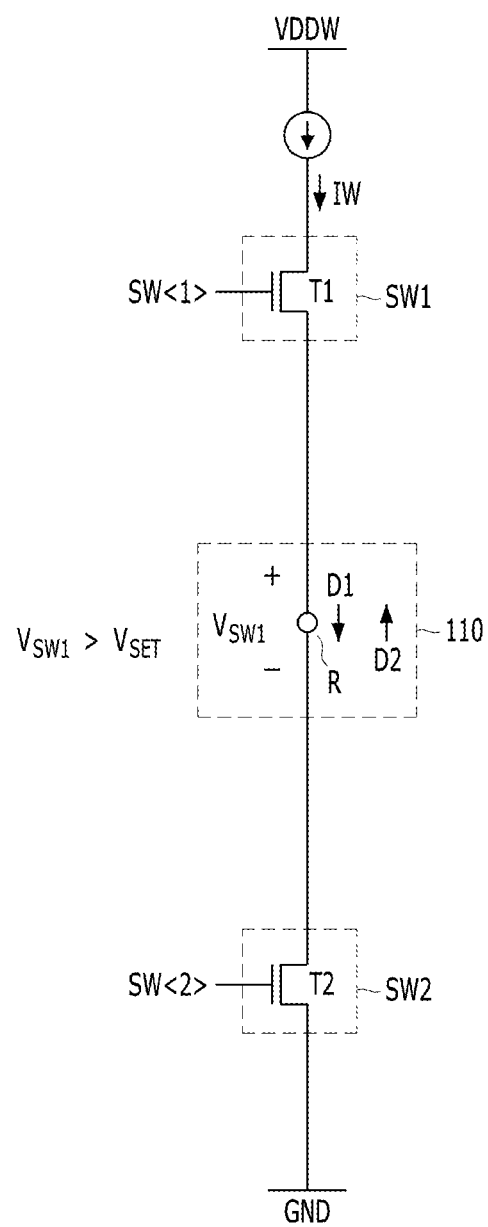
FIGS. 1A and 1B are diagrams for describing a write operation of a resistive memory cell.
Figure 1B:
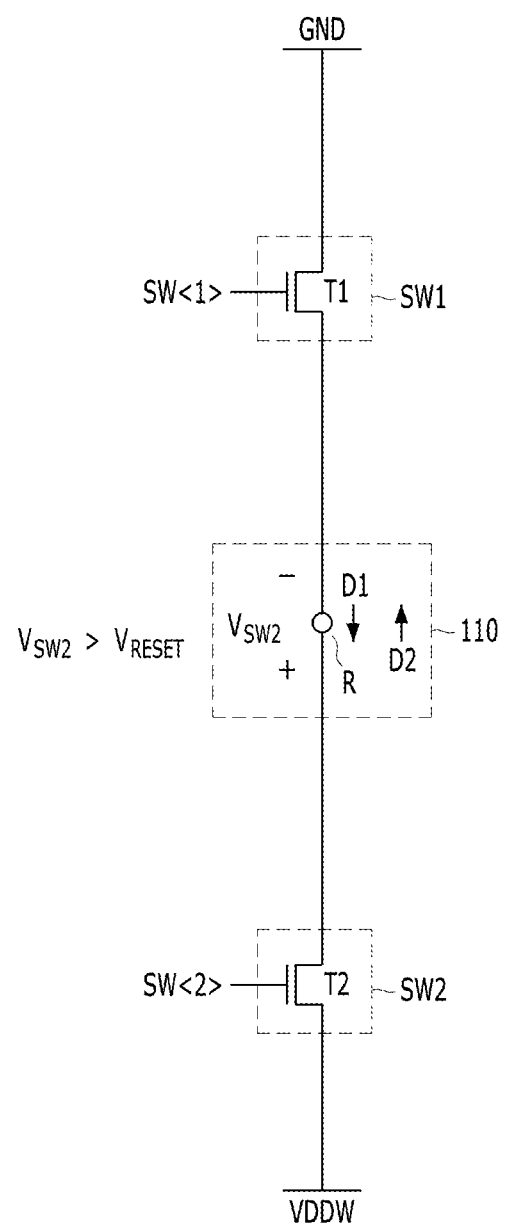

FIGS. 1A and 1B are diagrams for describing a write operation of a resistive memory cell.

Referring to FIGS. 1A and 1B, the resistive memory cell 110 may include a variable resistance element R. Both ends of the resistive memory cell 110 may be coupled to first and second switching units SW1 and SW2, respectively.

The variable resistance element R may have a low resistance state (also referred to as a set state) when first data (for example, data '0') is stored therein, and have a high resistance state (also referred to as a reset state) when second data (for example, data '1') is stored therein. As shown in FIG. 1A, when data '0' is written to the resistive memory cell 110, a write voltage VDDW may be applied to a first end of the first switching unit SW1, and a ground voltage GND may be applied to a first end of the second switching unit SW2. Thus, a write current IW may be supplied to the variable resistance element R in a first direction D1. As shown in FIG. 1B, when data '1' is written to the resistive memory cell 110, the ground voltage GND may be applied to the first end of the first switching unit SW1, and the write voltage VDDW may be applied to the first end of the second switching unit SW2.

When data is written to the resistive memory cell 110, the first and second switching units SW1 and SW2 may be turned on in response to first and second select signals SW<1> and SW<2>, respectively. The first and second select signals SW<1> and SW<2> have a higher voltage level than a predetermined level. In FIG. 1A, when the first and second switching units SW1 and SW2 are turned on, a first switching voltage $V_{SW1}$ may be applied across the variable resistance element R. In FIG. 1B, when the first and second switching units SW1 and SW2 are turned on, a second switching voltage $V_{SW2}$ may be applied across the variable resistance element R.

The variable resistance element R may be switched to the set state when a voltage larger than a set voltage $V_{SET}$ is applied thereto in the first direction D1, and the variable resistance element R may be switched to the reset state when a voltage larger than a reset voltage $V_{RESET}$ is applied thereto in a second direction D2 opposite to the first direction D1. That is, the variable resistance element R may be switched to the set state when the first switching voltage $V_{SW1}$ is larger than the set voltage $V_{SET}$, and switched to the reset state when the second switching voltage $V_{SW2}$ is larger than the reset voltage $V_{RESET}$.

The predetermined level may be a voltage level obtained by adding a level of the write voltage VDDW and a level of a threshold voltage of the switching unit SW1 or SW2. When the first and second select signals SW<1> and SW<2> have higher voltage levels than the predetermined level, first and second transistors T1 and T2 included in the first and second switching units SW1 and SW2, respectively, may operate in a linear region.

When data '0' is written to a memory cell, that is, when a variable resistance element is switched to a set state, a current source may be used to constantly maintain a current flowing through the variable resistance element, thereby narrowing a resistance distribution of the variable resistance element. As a result, a resistance deviation of the variable resistance element in the set state may be reduced.

Figure 2:
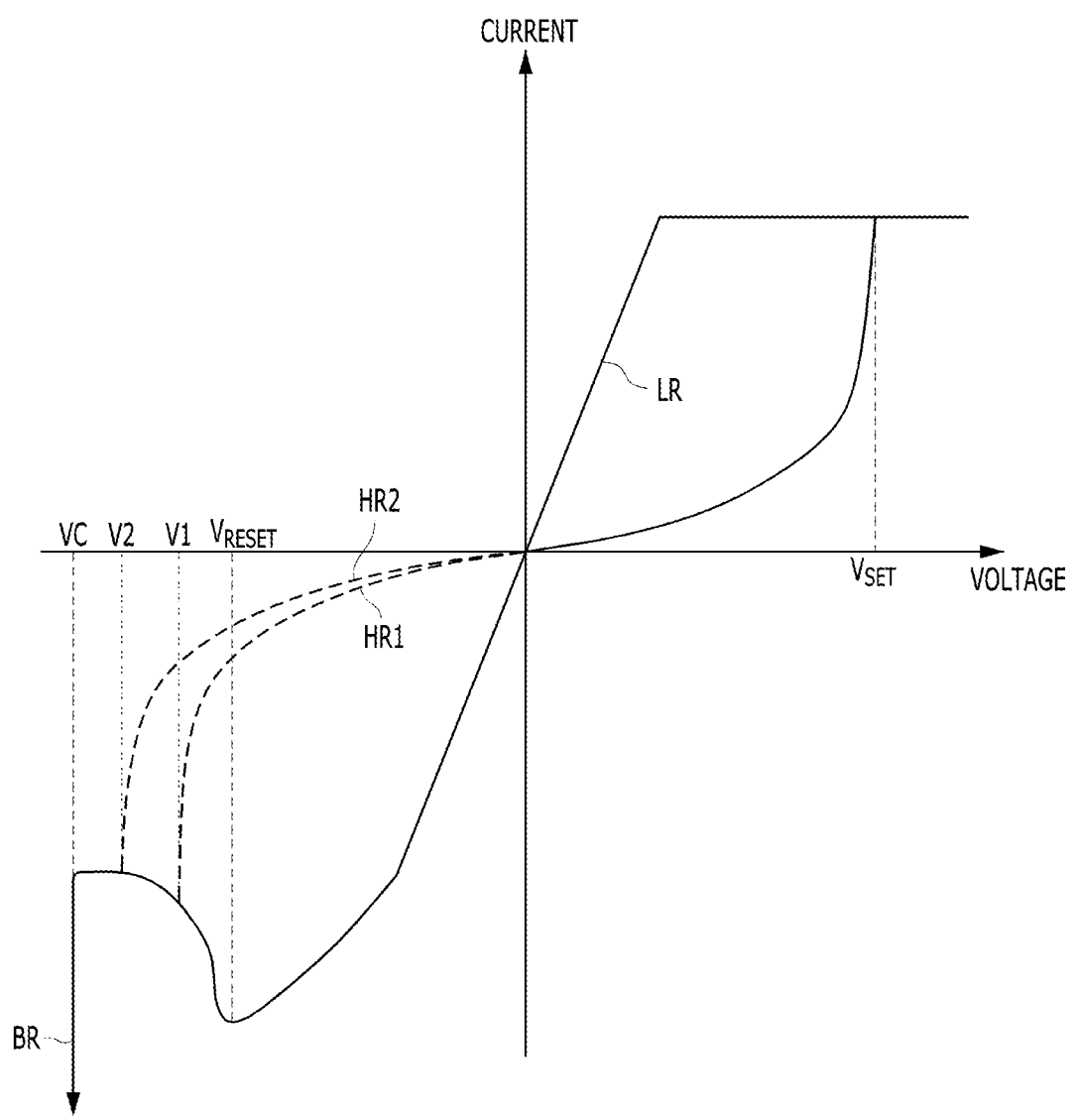
FIG. 2 is a voltage-current characteristic curve of a variable resistance element.

FIG. 2 is a voltage-current characteristic curve of the variable resistance element R in FIG. 1. In the characteristic curve of FIG. 2, the first direction D1 of FIG. 1 may correspond to a positive direction, and the second direction D2 of FIG. 1 may correspond to a negative direction.

Referring to FIG. 2, the variable resistance element R may be switched to a set state LR when a voltage larger than the set voltage $V_{SET}$ is applied thereto in the positive direction, and switched to a reset state HR1 or HR2 when a voltage larger than the reset voltage $V_{RESET}$ is applied thereto in the negative direction. However, when a voltage larger than a critical voltage VC is applied to the variable resistance element R in the negative direction, a breakdown BR may occur to thereby destroy the variable resistance element R.

Furthermore, a resistance value of the variable resistance element R may be in the reset state HR1 or HR2 depending on the magnitude of the second switching voltage $V_{SW2}$. Referring to FIG. 2, the variable resistance element R may have different resistance values in the reset states HR1 and HR2 when a voltage V1 is applied across the variable resistance element R and when a voltage V2 is applied across the variable resistance element R, respectively (magnitude of V2> magnitude of V1). When the voltage V2 is applied thereto, the variable resistance element R may have a larger resistance value than when the voltage V1 is applied thereto. Thus, the resistance value of the variable resistance element R in the reset state may increase as the magnitude of the second switching voltage $V_{SW2}$ increases in the range of $V_{RESET} < V_{SW2} < VC$.

Furthermore, as a difference in resistance values of the variable resistance element R between the set state and the reset state increases, a margin of a read operation, i.e., a read margin, of the resistive memory cell 110 may increase. Thus, the margin of the read operation may increase as the resistance value of the variable resistance element R in the set state decreases or the resistance value of the variable resistance element R in the reset state increases. Therefore, as shown in FIG. 2, when the variable resistance element R has a resistance value in the reset state HR2, rather than in the reset state HR1, the margin of the read operation may further increase.

Figure 3A:
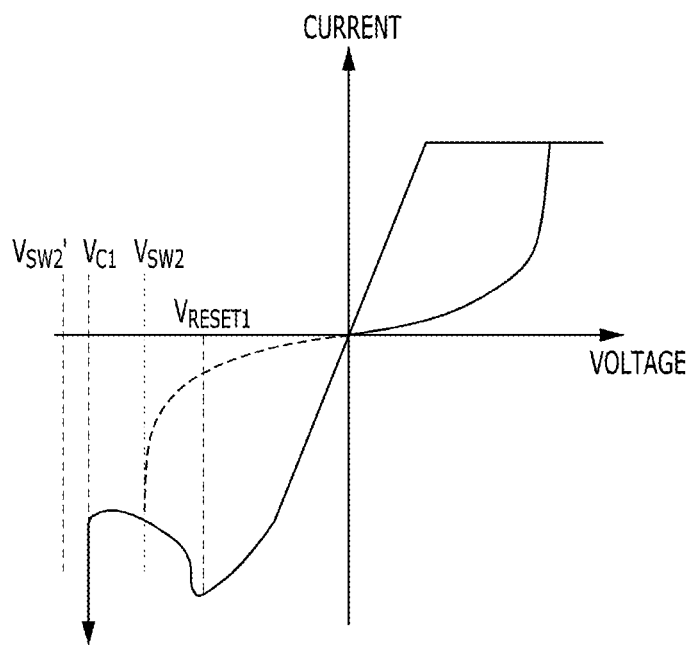
FIGS. 3A and 3B are voltage-current characteristic curves of variable resistance elements that are different from each other.
Figure 3B:
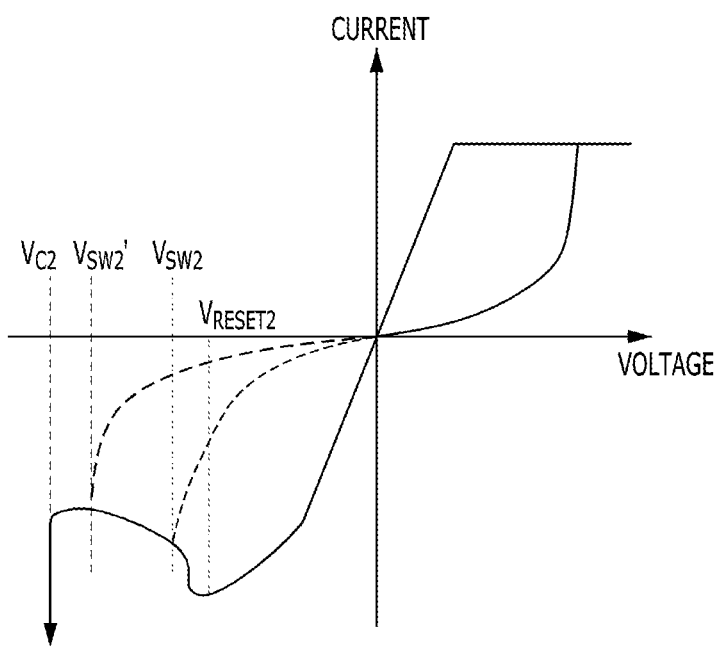

FIGS. 3A and 3B are voltage-current characteristic curves of variable resistance elements R-1 and R-2 that are different from each other, respectively. FIG. 3A is a characteristic curve of the variable resistance element R-1 having a critical voltage VC1 and a reset voltage $V_{RESET1}$, which have relatively small magnitudes, and FIG. 3B is a characteristic curve of the variable resistance element R-2 having a critical voltage VC2 and a reset voltage $V_{RESET2}$, which have relatively large magnitudes. That is, the magnitude of VC1 is smaller than that of VC2, and the magnitude of $V_{RESET1}$ is smaller than that of $V_{RESET2}$.

Even when the variable resistance elements R-1 and R-2, which have different voltage-current characteristics, are included in the same cell array, second switching voltages, which have the same magnitude, may be applied across the two variable resistance elements R-1 and R-2, respectively, when data '1' is written, thereby causing a breakdown in one of the variable resistance elements R-1 and R-2. For example, if a second switching voltage set to be smaller than the critical voltage VC1 is applied thereto, the resistance value of the variable resistance element R-2 in the reset state may decrease, such that the read margin is reduced. On the other hand, if a second switching voltage set close to the critical voltage VC2 is applied in order to increase the resistance value of the variable resistance element R-2 in the reset state, or particularly, if a second switching voltage set to be larger than the critical voltage VC1 is applied, a breakdown may occur in the variable resistance element R-1. Thus, the magnitudes of the second switching voltages need to be determined in consideration of the characteristics of the variable resistance elements R-1 and R-2.

A method is needed for improving a read margin by increasing the reset resistance values of the variable resistance elements R-1 and R-2 as much as possible and simultaneously preventing the occurrence of breakdown in the variable resistance element R-1. For this purpose, a proper reset voltage $V_{SW2}$ needs to be applied to the variable resistance element R-1, and a proper reset voltage $V_{SW2}'$ needs to be applied to the variable resistance element R-2.

Figure 4:
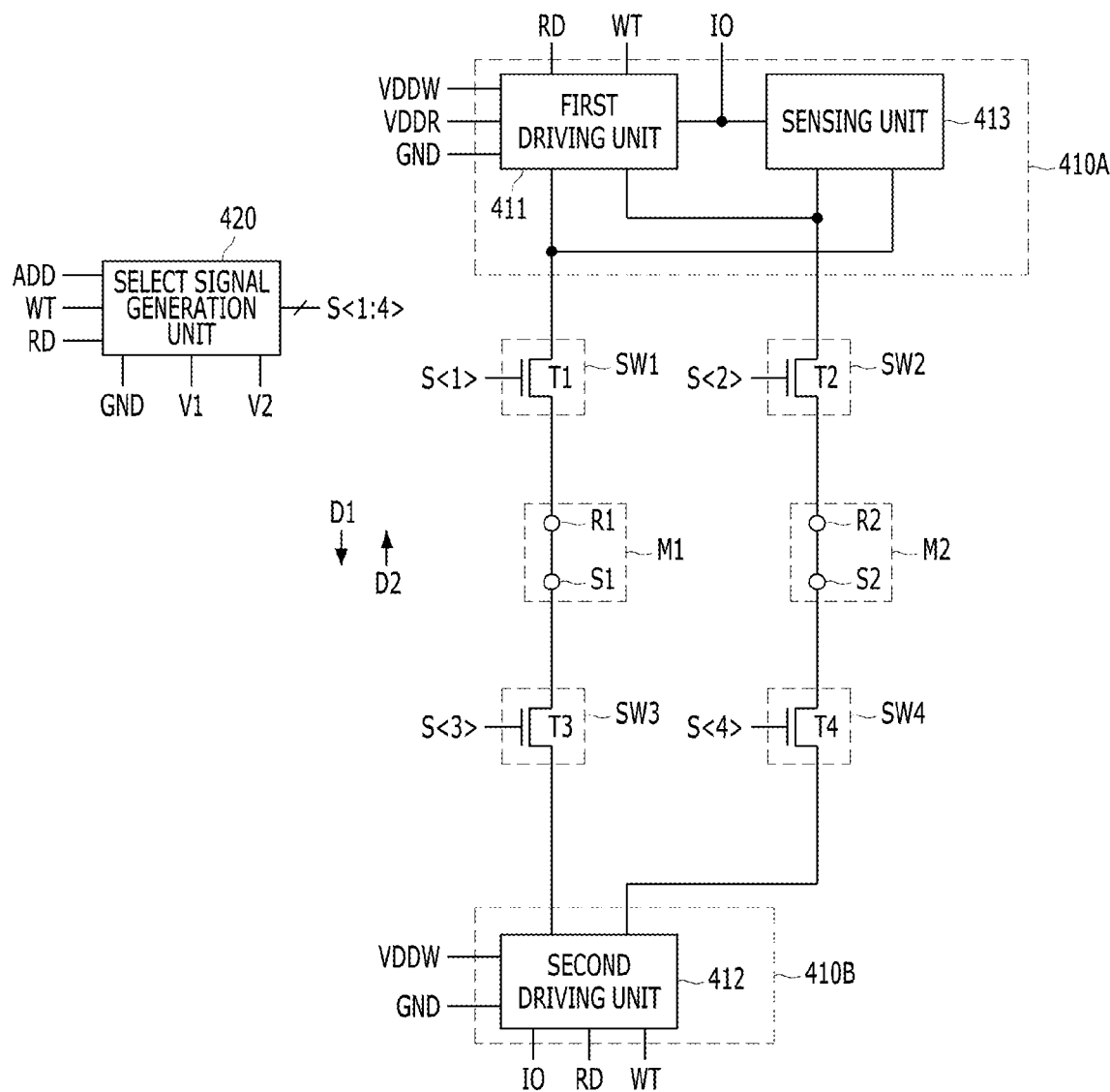
FIG. 4 illustrates a semiconductor memory unit (circuit or device) in accordance with an implementation.

FIG. 4 illustrates a semiconductor memory unit (circuit or device) in accordance with an implementation.

Referring to FIG. 4, the semiconductor memory unit (circuit or device) may include one or more resistive memory cells, e.g., M1 and M2, one or more first switching units, e.g., SW1 and SW2, one or more second switching units, e.g., SW3 and SW4, an access circuit 410, and a select signal generation unit 420. The memory cell M1 may include a variable resistance element R1 and a selecting element S1, and the memory cell M2 may include a variable resistance element R2 and a selecting element S2. The variable resistance elements R1 and R2 may each have a high resistance state (reset state) or low resistance state (set state) according to a logic value of data stored therein, and the selecting elements S1 and S2 may be coupled in series to the variable resistance elements R1 and R2, respectively. The variable resistance elements R1 and R2 may be switched to the set state when a write voltage VDDW is applied thereto in a first direction D1, and switched to the reset state when the write voltage VDDW is applied thereto in a second direction D2 opposite to the first direction D1.

The first switching units SW1 and SW2 may each be coupled between a corresponding memory cell and a first part 410A of the access circuit 410, and turned on in response to a corresponding select signal S<1> or S<2> when the corresponding memory cell is selected. The second switching units SW3 and SW4 may each be coupled between a corresponding memory cell and a second part 410B of the access circuit 410, and turned on in response to a corresponding select signal S<3> or S<4> when the corresponding memory cell is selected. The switching units SW1 to SW4 may include transistors T1 to T4, respectively.

In the semiconductor memory unit of FIG. 4, an enable level of the first switching units SW1 and SW2 may be equal to a level of the first voltage V1, and an enable level of the second switching units SW3 and SW4 may be equal to a level of the second voltage V2. The first and second voltages V1 and V2 may have levels which satisfy conditions of (VDDW+VTH+VSTH<V1) and ($V_{RESET}$+VTH+VSTH≤V2<VDDW+VTH+VSTH), respectively, wherein VTH may represent a threshold voltage of the switching units SW1 to SW4, and VSTH may represent a threshold voltage of the selecting elements S1 and S2.

As voltage levels of the select signals S<3> and S<4>, for controlling the second switching units SW3 and SW4, respectively, are separately adjusted, the voltages applied across the variable resistance elements R1 and R2 may differ depending on the characteristics of the variable resistance elements R1 and R2, even though the write voltages VDDW applied to first ends of the second switching units SW3 and SW4 are equal to each other when data '1' is written. That is, although the write voltages VDDW, having the same level, are applied to the first ends of the second switching units SW3 and SW4, proper switching voltages may be applied across the variable resistance elements R1 and R2 according to the characteristics of the variable resistance elements R1 and R2, when the second switching units SW3 and SW4 are turned on by the second voltage V2. This will be described below.

The access circuit 410 may apply the write voltage VDDW across a memory cell selected from the memory cells M1 and M2 in the first direction D1 when data '0' is written, and apply the write voltage VDDW across the memory cell selected from the memory cells M1 and M2 in the second direction D2 when data '1' is written. When the write voltage VDDW is applied in the first direction D1, it may indicate that the write voltage VDDW is applied to a first end of the first switching unit corresponding to the selected memory cell, and the ground voltage GND is applied to a first end of the second switching unit corresponding to the selected memory cell. On the other hand, when the write voltage VDDW is applied in the second direction D2, it may indicate that the write voltage VDDW is applied to the first end of the second switching unit corresponding to the selected memory cell, and the ground voltage GND is applied to the first end of the first switching unit corresponding to the selected memory cell.

The access circuit 410 may apply a read voltage VDDR across a memory cell selected from the memory cells M1 and M2 in the first direction D1 when data is read from the selected memory cell, and sense a resistance value of the selected memory cell by detecting a current flowing through the selected memory cell.

For this operation, the first part 410A of the access circuit 410 may include first driving unit 411 and a sensing unit 413. The second part 410B of the access circuit 410 may include a second driving unit 412. The first and second driving units 411 and 412 may drive the first and second switching units SW1 to SW4 to a predetermined voltage during a write or read operation.

During a write operation in which a signal WT is activated, the first driving unit 411 may drive first ends of the first switching units SW1 and SW2 to the write voltage VDDW when data of an input/output terminal IO is data '0,' and may drive the first ends of the first switching units SW1 and SW to the ground voltage GND when data of the terminal IO is data '1.' During a read operation in which a signal RD is activated, the first driving unit 411 may drive the first ends of the first switching units SW1 and SW2 to the read voltage VDDR.

Meanwhile, during the write operation, the second driving unit 412 may drive first ends of the second switching units SW3 and SW4 to the ground voltage GND when data of the terminal IO is data '0,' and may drive the first ends of the second switching units SW3 and SW4 to the write voltage VDDW when data of the terminal IO is data '1.' During the read operation, the second driving unit 412 may drive the first ends of the second switching units SW3 and SW4 to the ground voltage GND.

The sensing unit 413 may sense a current flowing through a selected memory cell during the read operation, and detect whether the variable resistance element of the selected memory cell has the set state or the reset state. When the variable resistance element has the set state, the sensing unit 413 may output data '0' to the terminal IO. On the other hand, when the variable resistance element has the reset state, the sensing unit 413 may output data '1' to the terminal IO.

The select signal generation unit 420 may generate the select signals S<1:4> in response to the signal WT, the signal RD, and an address ADD. The select signal generation unit 420 may activate the select signals S<1> and S<3> when the memory cell M1 is selected by the address ADD, and may activate the select signals S<2> and S<4> when the memory cell M2 is selected by the address ADD. When the signal WT is activated, the select signal generation unit 420 may activate the select signals S<1> and S<2> to the level of the first voltage V1, and activate the select signal S<3> and S<4> to the level of the second voltage V2. Furthermore, the select signal generation unit 420 may activate the select signals S<1:4> to the level of the first voltage V1 when the signal RD is activated.

The semiconductor memory unit of FIG. 4 may control the second switching units SW3 and SW4 using the second voltage V2, which is different from the first voltage V1, during the write operation, and thus prevent a voltage equal to or larger than a critical voltage from being applied across the variable resistance element of the selected memory cell, and simultaneously applying a reset voltage corresponding to the characteristic of the variable resistance element across the variable resistance element when data '1' is written. Such a method may prevent a breakdown of the variable resistance element and simultaneously increase the resistance value of the variable resistance element in the reset state as much as possible.

Figure 5:
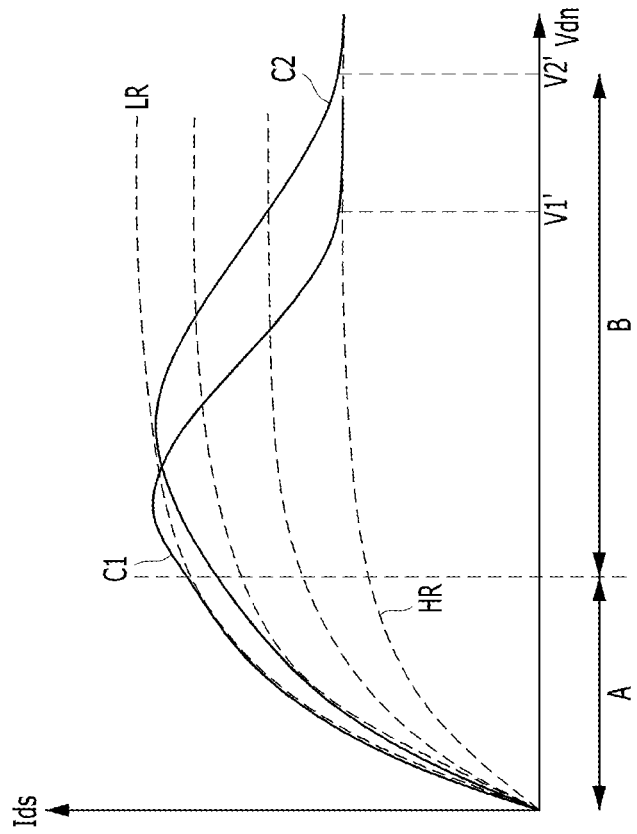
FIG. 5 is a diagram for describing an operation of writing data to a selected memory cell in the semiconductor memory unit of FIG. 4.
Figure 5:
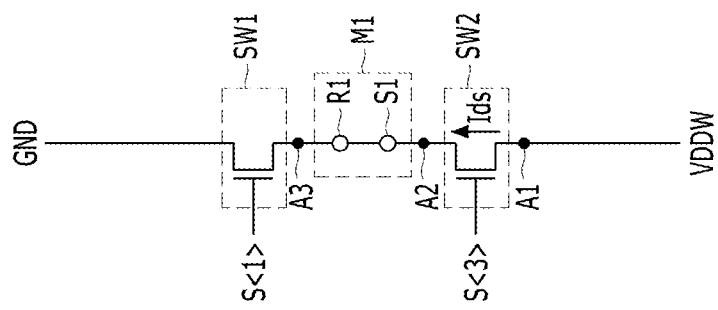

FIG. 5 is a diagram for describing an operation of writing data '1' into the selected memory cell M1 in the semiconductor memory unit of FIG. 4. Hereafter, a voltage between a terminal A1 and a terminal A3 will be represented by Vdn, a voltage between the terminal Al and a terminal A2 will be represented by Vds, a voltage between the terminal A2 and the terminal A3 will be represented by Vcell, and a current flowing across a switching unit SW2 will be represented by Ids. Furthermore, LR may be a voltage-current curve when the variable resistance element R1 has a set resistance value, and HR may be a voltage-current curve when the variable resistance element R1 has a reset resistance value.

The voltage-current curves of FIG. 5 illustrate changes of the current Ids based on changes of the voltage Vdn. Among the voltage-current curves, a curve C1 may be a voltage-current curve when the variable resistance element R1 has the characteristic of FIG. 3A, and a curve C2 may be a voltage-current curve when the variable resistance element R1 has the characteristic of FIG. 3B.

Referring to FIG. 5, the ground voltage GND may be applied to a first end of the first switching unit SW1 of the selected memory cell M1, and the write voltage VDDW may be applied to a first end of the second switching unit SW2. The first switching unit SW1 may be turned on in response to the select signal S<1> having the level of the first voltage V1, and the second switching unit SW2 may be turned on in response to the select signal S<3> having the level of the second voltage V2. Referring to the voltage-current curves C1 and C2, a transistor in the switching unit SW2 controlled by the select signal S<3> may operate in a linear region (region A) after a reset operation has started, and operate in a saturation region (region B) after the reset operation ends.

The voltage-current curves C1 and C2 before the reset operation ends may correspond to the voltage-current curve LR, and the voltage-current curves C1 and C2 after the reset operation ends may correspond to the voltage-current curve HR. In the voltage-current curve C1, a value of the voltage Vdn at which switching is completed in the reset state is V1'. In the voltage-current curve C2, the value of the voltage Vdn at which switching is completed in the reset state is V2'. After the reset operation is completed, the transistor controlled by the select signal S<3> operates in the saturation region, and thus the voltage Vcell does not change significantly. The reason may be explained as follows.

Since the voltage Vcell is proportional to (resistance value of R1)*Ids, the resistance value of the variable resistance element R1 does not change after the reset operation is completed. Furthermore, since the transistor controlled by the select signal S<3> is in a saturation state when the variable resistance element R1 is completely reset, the current Ids does not change. Therefore, during the reset operation, the maximum value of the voltage Vcell may be properly adjusted to a value corresponding to the voltage V1' or V2' according to the characteristic of the variable resistance element R1, without relying on the write voltage VDDW.

That is, the voltage applied across the variable resistance element R1 when data '1' is written may be set to a level corresponding to (resistance value of the variable resistance element R1)*(the saturated current Ids), that is, to a voltage determined according to the characteristic of the variable resistance element R1. Thus, the resistance value of the variable resistance element R1 in the reset state may be increased to the maximum value while the possibility of breakdown of the variable resistance element R1 is reduced. That is, it is possible to increase the read margin of the semiconductor memory unit, and simultaneously reduce the possibility that the variable resistance element R1 will be destroyed due to a breakdown.

A resistive memory device may include a memory cell array with a cross-point array structure. The cross point array structure may be a structure in which a plurality of bottom electrodes (for example, a plurality of row lines) and a plurality of top electrodes (for example, a plurality of column lines) cross each other, and a plurality of memory cells each including a variable resistance element and a selecting element are arranged at intersections of the bottom electrodes and the top electrodes.

Figure 6:
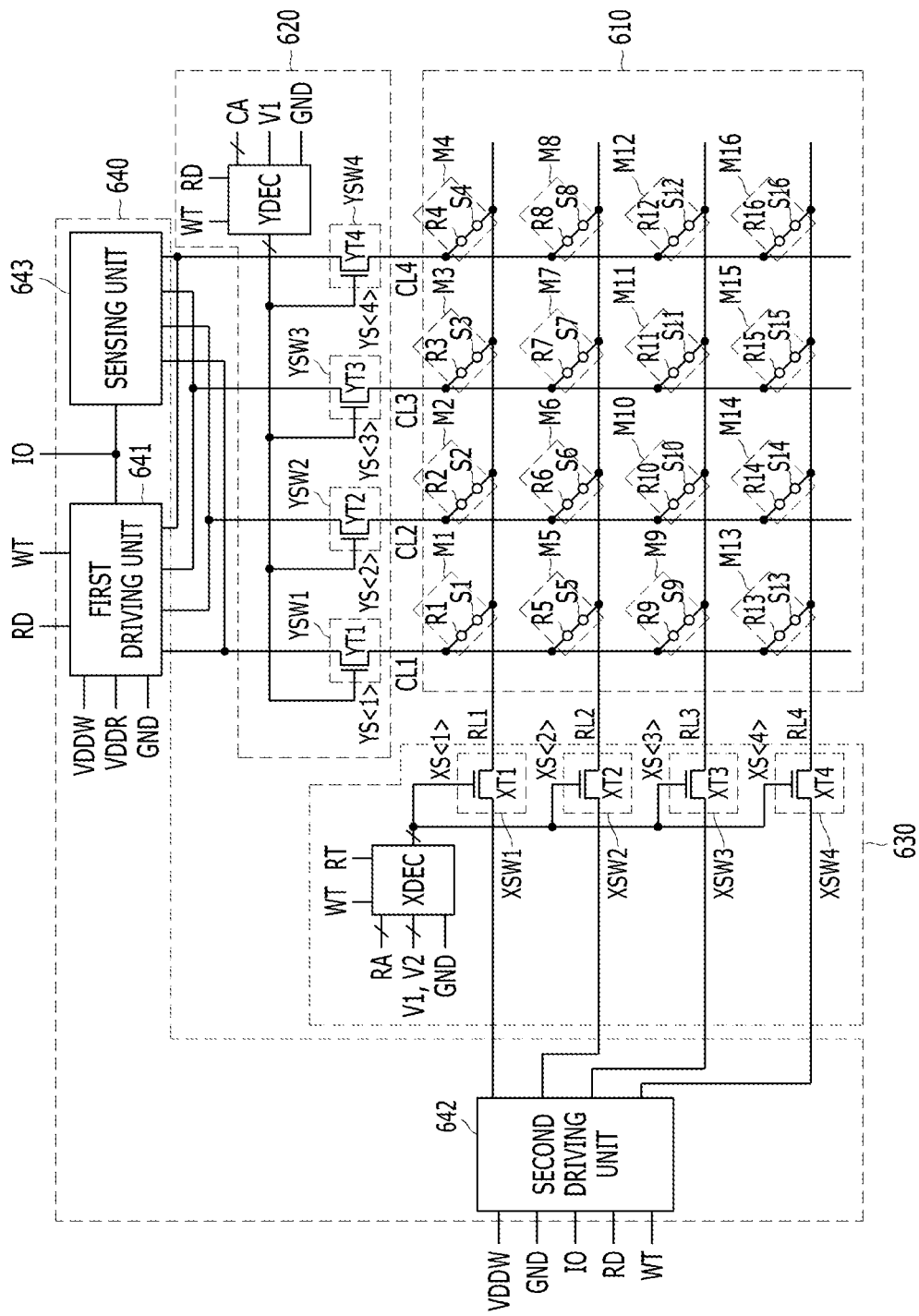
FIG. 6 is a configuration diagram of a semiconductor memory unit (circuit or device) in accordance with an implementation.

FIG. 6 illustrates a semiconductor memory unit (circuit or device) in accordance with an implementation.

Referring to FIG. 6, the semiconductor memory unit may include a cell array 610, a column selection circuit 620, a row selection circuit 630, and an access circuit 640.

The cell array 610 may include a plurality of column lines CL1 to CL4 (also referred to as bit lines), a plurality of row lines RL1 to RL4 (also referred to as word lines), and memory cells M1 to M16 disposed at respective intersections of the column lines CL1 to CL4 and the row lines RL1 to RL4. For illustrative convenience, FIG. 6 illustrates that the cell array 610 has a configuration of 4 rows and 4 columns. However, the cell array 610 may have a configuration of several tens to hundreds of rows and several tens to hundreds of columns.

The memory cells M1 to M16 may include variable resistance elements R1 to R16 and selecting elements S1 to S16, respectively. The variable resistance elements R1 to R16 may have a set state (low resistance state) when first data (for example, data '0') is stored therein, and may have a reset state (high resistance state) when second data (for example, data '1') is stored therein. Each of the selecting elements S1 to S16 may be coupled in series to a corresponding one of the variable resistance elements R1 to R16. Each of the selecting elements S1 to S16 may be implemented with a diode or OTS (Ovonic Threshold Switch).

FIG. 6 illustrates that the variable resistance elements R1 to R16 in the memory cells M1 to M16 are directly coupled to the column lines C1 to C4, respectively, and that the selecting elements S1 to S16 in the memory cells M1 to M16 are directly coupled to the row lines RL1 to RL4, respectively. However, in another implementation, the positions of the variable resistance element and the selecting element may be exchanged.

The column selection circuit 620 may couple a column line, selected by a column address CA among the column lines CL1 to CL4, to the access circuit 640 during a write or read operation. The column selection circuit 620 may include a first decoding unit YDEC and a plurality of first switching units YSW1 to YSW4.

The first decoding unit YDEC may activate a column select signal selected by decoding the column address CA among a plurality of column select signals YS<1:4> to a first voltage V1 when a signal WT indicating a write operation or a signal RD indicating a read operation is activated, and may deactivate unselected column select signals among the plurality of column select signals YS<1:4> to a ground voltage GND. The first voltage V1 may satisfy a condition of (VDDW+VTH+VSTH<V1).

The plurality of first switching units YSW1 to YSW4 may be coupled to and disposed between the access circuit 640 and the respective column lines CL1 to CL4, and may be controlled by the column select signals YS<1:4>, respectively. The first switching units YSW1 to YSW4 may be turned on when the respective column select signals YS<1:4> are activated, and may be turned off when the respective column select signals YS<1:4> are deactivated. The first switching units YSW1 to YSW4 may include first transistors YT1 to YT4, respectively, and each of the first transistors YT1 to YT4 may be configured to receive a corresponding column select signal through a gate thereof.

The row selection circuit 630 may couple a row line selected by a row address RA among the row lines RL1 to RL4 to the access circuit 640 during a write or read operation. The row selection circuit 630 may include a second decoding unit XDEC and a plurality of second switching units XSW1 to XSW4.

The second decoding unit XDEC may activate a row select signal selected by decoding the row address RA among a plurality of row select signals XS<1:4> to the first voltage V1 when the signal RD is activated, and may deactivate unselected row select signals among the row select signals XS<1:4> to the ground voltage GND. Furthermore, when the signal WT is activated, the second decoding unit XDEC may activate the selected row select signal to a second voltage V2, and deactivate the unselected row select signals to the ground voltage GND. The second voltage V2 may satisfy a condition of ($V_{RESET}$+VTH+VSTH≤V2<VDDW+VTH+VSTH).

The plurality of second switching units XSW1 to XSW4 may be coupled to and disposed between the access circuit 640 and the respective row lines RL1 to RL4, and controlled by the row select signals XS<1:4>, respectively. The second switching units XSW1 to XSW4 may be turned on when the respective row select signals XS<1:4> are activated, and turned off when the respective row select signals XS<1:4> are deactivated. The second switching units XSW1 to XSW4 may include second transistors XT1 to XT4, respectively, and each of the second transistors XT1 to XT4 may be configured to receive a corresponding row select signal through a gate thereof.

The access circuit 640 may apply a write voltage VDDW to a selected column line among the column lines CL1 to CL4 when data '0' is written, and apply the ground voltage GND to a selected column line among the column lines CL1 to CL4 when data '1' is written. The access circuit 640 may apply the ground voltage GND to a selected row line among the row lines RL1 to RL4 when data '0' is written, and apply the write voltage VDDW to a selected row line among the row lines RL1 to RL4 when data '1' is written. When data is read from a selected memory cell coupled to the selected column line and the selected row line, the access circuit 640 may apply a read voltage VDDR to the selected column line, apply the ground voltage GND to the selected row line, and sense a resistance value of the selected memory cell by detecting a current flowing through the selected memory cell.

For this operation, the access circuit 640 may include first and second driving units 641 and 642 and a sensing unit 643. The first driving unit 641 may drive the first switching units YSW1 to YSW4, and the second driving unit 642 may drive the second switching units XSW1 to XSW4, during a write or read operation.

During a write operation in which a signal WT is activated, the first driving unit 641 may drive first ends of the first switching units YSW1 to YSW4 to the write voltage VDDW when data of an input/output terminal IO is data '0,' and drive the first ends of the first switching units YSW1 to YSW4 to the ground voltage GND when data of the terminal IO is data '1.' During a read operation in which a signal RD is activated, the first driving unit 641 may drive the first ends of the first switching units YSW1 to YSW4 to the read voltage VDDR.

During the write operation, the second driving unit 642 may drive first ends of the second switching units XSW1 to XSW4 to the ground voltage GND when data of the terminal IO is data '0,' and drive the first ends of the second switching units XSW1 to XSW4 to the write voltage VDDW when data of the terminal IO is data '1.' During the read operation, the second driving unit 642 may drive the first ends of the second switching units XSW1 to XSW4 to the ground voltage GND.

The sensing unit 643 may sense a current flowing through the selected memory cell during the read operation, and detect whether a variable resistance element of the selected memory cell has the set state or the reset state. The sensing unit 643 may output data '0' to the terminal IO when the variable resistance element has the set state, and may output data '1' to the terminal IO when the variable resistance element has the reset state.

When data '1' is written, the semiconductor memory unit of FIG. 6 may control the second switching unit, coupled to the selected row line, with the second voltage V2, which is different from the first voltage V1, during the write operation, and thus prevent a voltage equal to or greater than a critical voltage from being applied across the variable resistance element of the selected memory cell while a reset voltage corresponding to the characteristic of the variable resistance element is applied across the variable resistance element. Such a method may prevent a breakdown of the variable resistance element while increasing the resistance value of the variable resistance element in the reset state as much as possible.

Figure 7A:
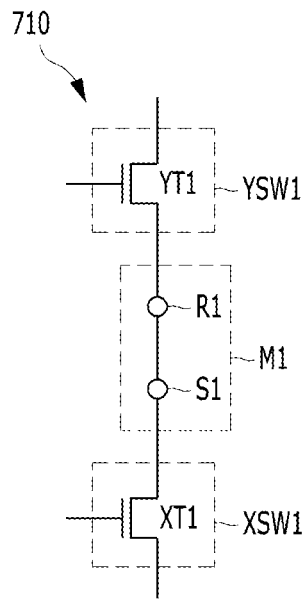
FIGS. 7A to 7C illustrate configurations of switching units in accordance with various implementations.
Figure 7B:
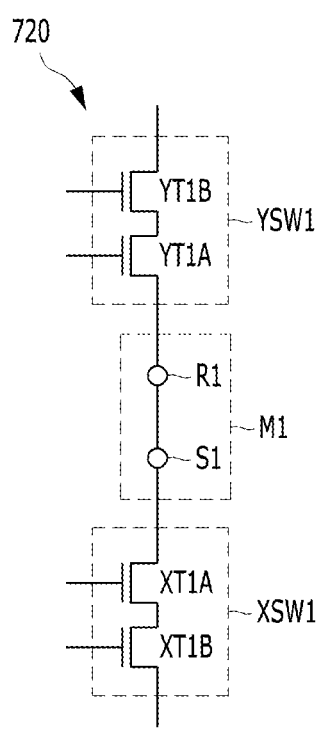
Figure 7C:
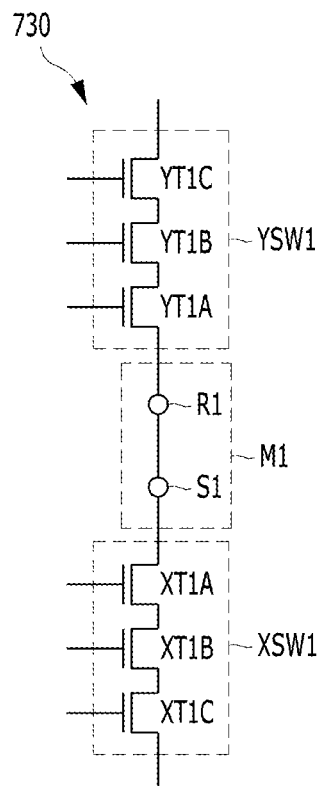

FIGS. 7A to 7C illustrate configurations of switching units in accordance with various implementations.

Referring to FIGS. 7A to 7C, a first implementation 710 may be a case in which each of the first and second switching units YSW1 and XSW1 includes one transistor YT1 or XT1, a second implementation 720 may be a case in which each of the first and second switching units YSW1 and XSW1 includes two transistors YT1A and YT1B or XT1A and XT1B, and a third implementation 730 may be a case in which each of the first and second switching units YSW1 and XSW1 includes three transistors YT1A, YT1B, and YT1C or XT1A, XT1B, and XT1C. That is, FIGS. 7A to 7C illustrate cases in which a switching unit includes one, two, and three transistors, respectively. However, in other implementations, the switching unit may include four or more transistors. Each transistor may be controlled by a select signal generated by decoding a column address or row address.

In accordance with the implementations, gate voltages of transistors coupled to both ends of a variable resistance element may be adjusted to apply a proper reset voltage across the variable resistance element regardless of a deviation in a resistance value of the variable resistance element.

Furthermore, proper voltages may be applied across variable resistance elements to prevent a breakdown or degradation in distribution of resistance values of the variable resistance elements in a reset state.

The above and other memory circuits or semiconductor devices based on the disclosed technology can be used in a range of devices or systems. FIGS. 8-12 provide some examples of devices or systems that can implement the memory circuits disclosed herein.

Figure 8:
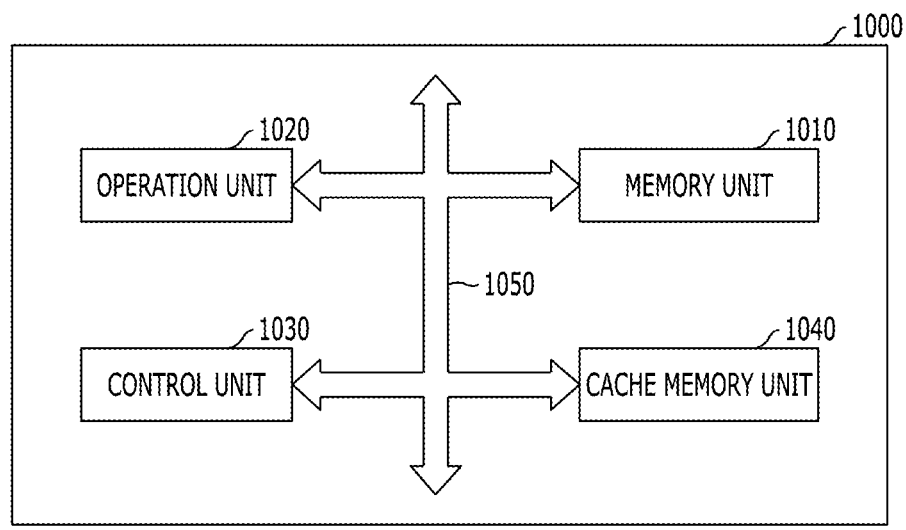
FIG. 8 shows an example of a configuration diagram of a microprocessor implementing memory circuitry based on the disclosed technology.

FIG. 8 shows an example of a configuration diagram of a microprocessor based on another implementation of the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 may include: one or more resistive memory cells; an access circuit suitable for applying a write voltage across a selected resistive memory cell among the one or more resistive memory cells in a first or second direction, during a write operation; one or more first switching units each coupled between the access circuit and one end of a corresponding resistive memory cell, and turned on in response to a first voltage when the corresponding resistive memory cell is selected, during a write operation; and one or more second switching units each coupled between the access circuit and the other end of a corresponding resistive memory cell, and turned on in response to a second voltage when the corresponding resistive memory cell is selected, during a write operation. Through this, a read margin of the memory unit 1010 may be increased. Consequently, performance of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
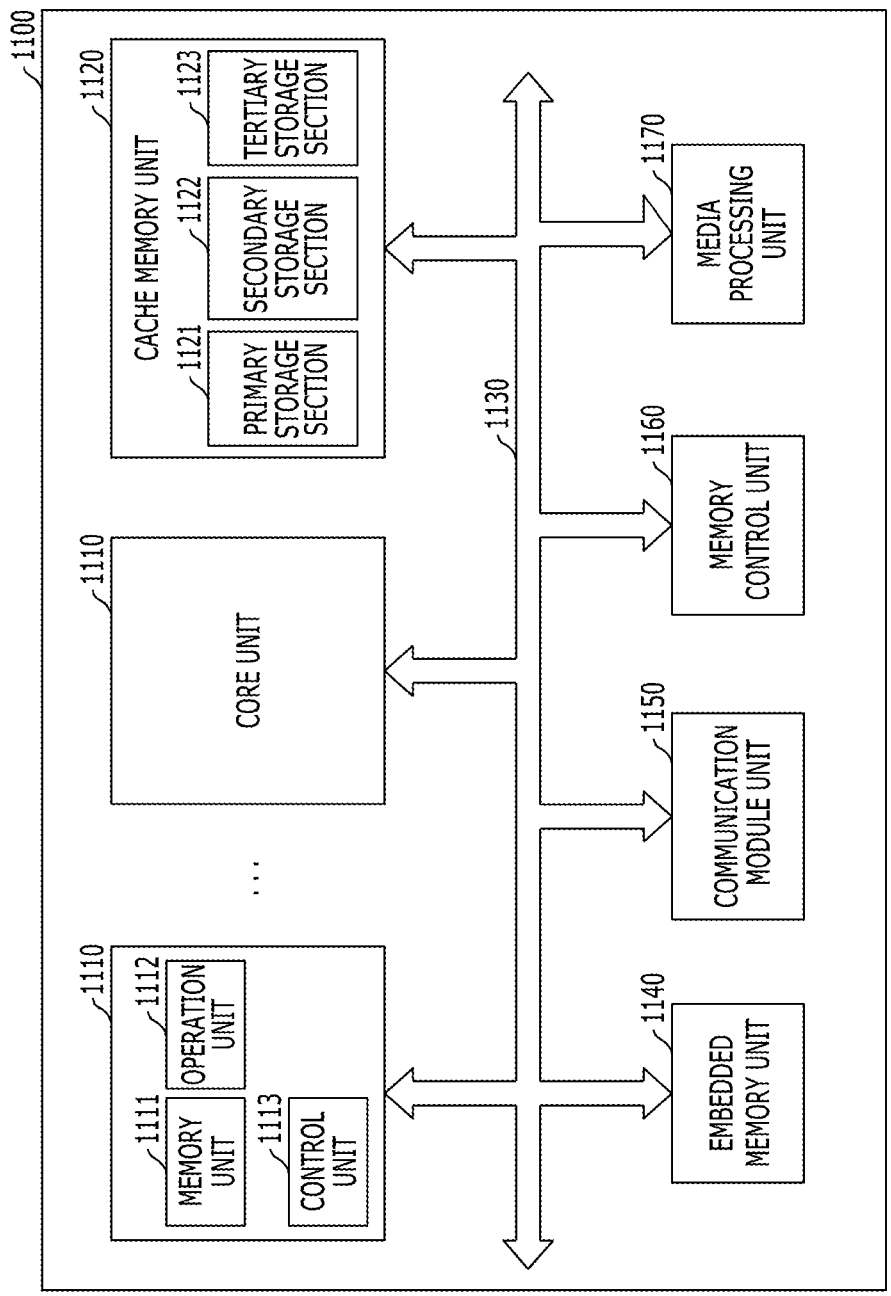
FIG. 9 shows an example of a configuration diagram of a processor implementing memory circuitry based on the disclosed technology.

FIG. 9 is a configuration diagram of a processor based on another implementation of the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 may include: one or more resistive memory cells; an access circuit suitable for applying a write voltage across a selected resistive memory cell among the one or more resistive memory cells in a first or second direction, during a write operation; one or more first switching units each coupled between the access circuit and one end of a corresponding resistive memory cell, and turned on in response to a first voltage when the corresponding resistive memory cell is selected, during a write operation; and one or more second switching units each coupled between the access circuit and the other end of a corresponding resistive memory cell, and turned on in response to a second voltage when the corresponding resistive memory cell is selected, during a write operation. Through this, a read margin of the cache memory unit 1120 may be increased. Consequently, performance of the processor 1100 may be improved.

Although it was shown in FIG. 9 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110.The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage units 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130.The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device(HD audio), a high definition multimedia interface (HDMI) controller, and so on.

Figure 10:
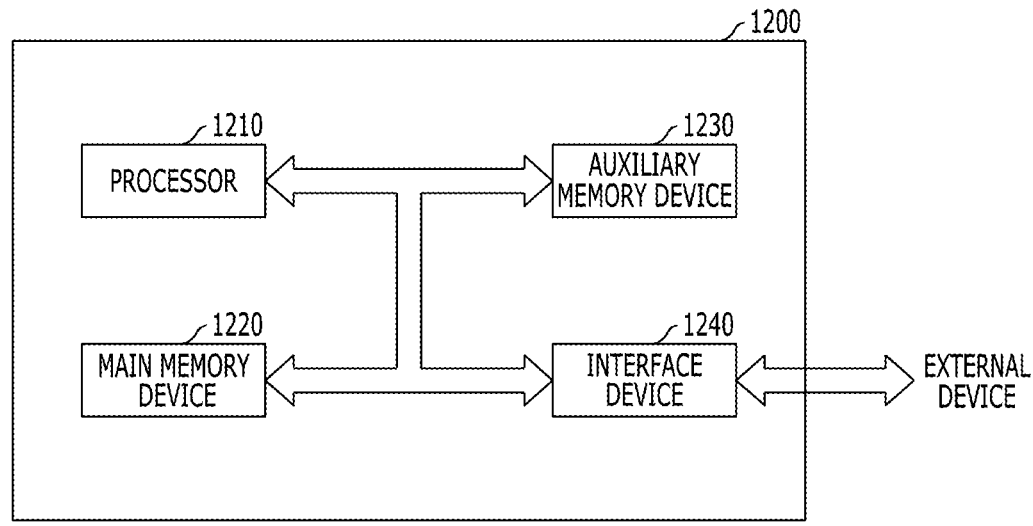
FIG. 10 shows an example of a configuration diagram of a system implementing memory circuitry based on the disclosed technology.

FIG. 10 is a configuration diagram of a system based on another implementation of the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include: one or more resistive memory cells; an access circuit suitable for applying a write voltage across a selected resistive memory cell among the one or more resistive memory cells in a first or second direction, during a write operation; one or more first switching units each coupled between the access circuit and one end of a corresponding resistive memory cell, and turned on in response to a first voltage when the corresponding resistive memory cell is selected, during a write operation; and one or more second switching units each coupled between the access circuit and the other end of a corresponding resistive memory cell, and turned on in response to a second voltage when the corresponding resistive memory cell is selected, during a write operation. Through this, a read margin of the main memory device 1220 may be increased. Consequently, performance of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include: one or more resistive memory cells; an access circuit suitable for applying a write voltage across a selected resistive memory cell among the one or more resistive memory cells in a first or second direction, during a write operation; one or more first switching units each coupled between the access circuit and one end of a corresponding resistive memory cell, and turned on in response to a first voltage when the corresponding resistive memory cell is selected, during a write operation; and one or more second switching units each coupled between the access circuit and the other end of a corresponding resistive memory cell, and turned on in response to a second voltage when the corresponding resistive memory cell is selected, during a write operation. Through this, a read margin of the auxiliary memory device 1230 may be increased. Consequently, performance of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
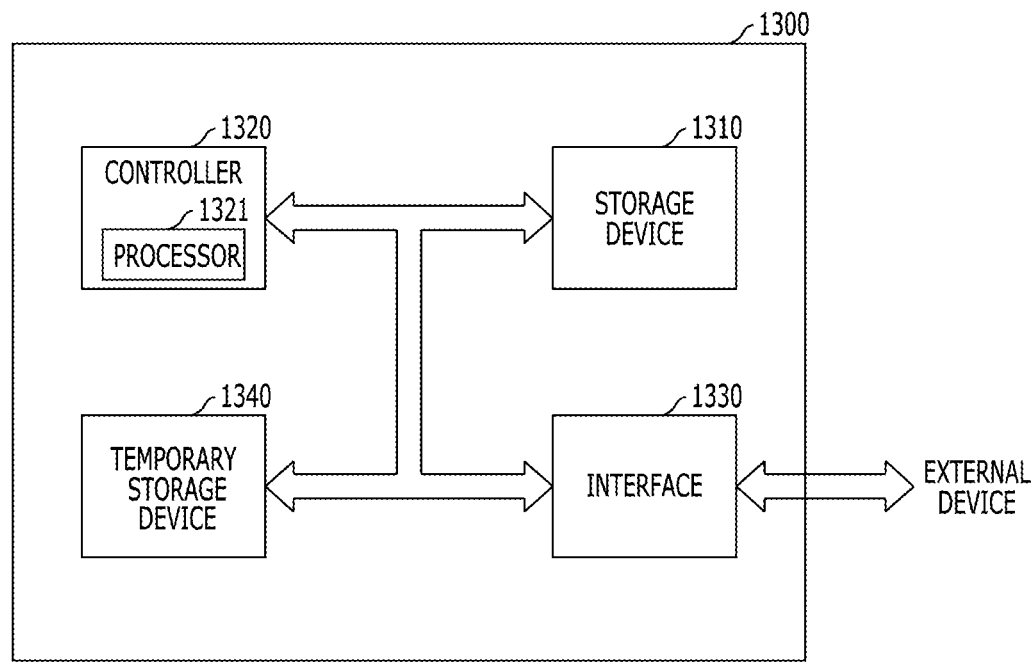
FIG. 11 shows an example of a configuration diagram of a data storage system implementing memory circuitry based on the disclosed technology.

FIG. 11 is a configuration diagram of a data storage system based on another implementation of the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. For example, the temporary storage device 1340 may include: one or more resistive memory cells; an access circuit suitable for applying a write voltage across a selected resistive memory cell among the one or more resistive memory cells in a first or second direction, during a write operation; one or more first switching units each coupled between the access circuit and one end of a corresponding resistive memory cell, and turned on in response to a first voltage when the corresponding resistive memory cell is selected, during a write operation; and one or more second switching units each coupled between the access circuit and the other end of a corresponding resistive memory cell, and turned on in response to a second voltage when the corresponding resistive memory cell is selected, during a write operation. Through this, a read margin of the temporary storage device 1340 may be increased. Consequently, performance of the data storage system 1300 may be improved.

Figure 12:
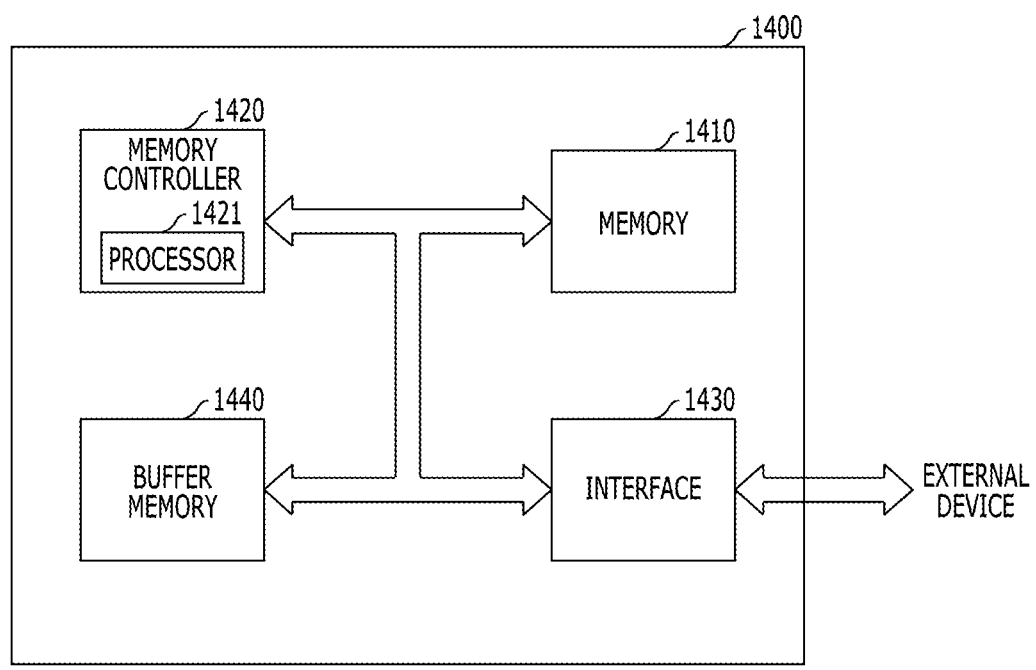
FIG. 12 shows an example of a configuration diagram of a memory system implementing memory circuitry based on the disclosed technology.

FIG. 12 is a configuration diagram of a memory system based on another implementation of the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include: one or more resistive memory cells; an access circuit suitable for applying a write voltage across a selected resistive memory cell among the one or more resistive memory cells in a first or second direction, during a write operation; one or more first switching units each coupled between the access circuit and one end of a corresponding resistive memory cell, and turned on in response to a first voltage when the corresponding resistive memory cell is selected, during a write operation; and one or more second switching units each coupled between the access circuit and the other end of a corresponding resistive memory cell, and turned on in response to a second voltage when the corresponding resistive memory cell is selected, during a write operation. Through this, a read margin of the memory 1410 may be increased. Consequently, performance of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include: one or more resistive memory cells; an access circuit suitable for applying a write voltage across a selected resistive memory cell among the one or more resistive memory cells in a first or second direction, during a write operation; one or more first switching units each coupled between the access circuit and one end of a corresponding resistive memory cell, and turned on in response to a first voltage when the corresponding resistive memory cell is selected, during a write operation; and one or more second switching units each coupled between the access circuit and the other end of a corresponding resistive memory cell, and turned on in response to a second voltage when the corresponding resistive memory cell is selected, during a write operation. Through this, a read margin of the buffer memory 1440 may be increased. Consequently, performance of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit,
wherein the semiconductor memory unit comprises:
one or more resistive memory cells;
an access circuit including a first access part and a second access part and suitable for applying, during a write operation, a write voltage across a selected resistive memory cell among the resistive memory cells in a first or second direction;
one or more first switching units, each of which is coupled to and disposed between the first access part of the access circuit and a first end of a corresponding resistive memory cell among the resistive memory cells and turned on in response to a first voltage having a level higher than a predetermined level when the corresponding resistive memory cell is selected during the write operation; and
one or more second switching units, each of which is coupled to and disposed between the second access part of the access circuit and a second end of the corresponding resistive memory cell among the resistive memory cells and turned on in response to a second voltage having a level equal to or lower than the predetermined level when the corresponding resistive memory cell is selected during the write operation.

2. The electronic device of claim 1, wherein each of the resistive memory cells comprises:
a variable resistance element having a high resistance state or low resistance state according to a logic value of data stored therein; and
a selecting element coupled in series to the variable resistance element.

3. The electronic device of claim 2, wherein the predetermined level corresponds to a full-turn-on level that is equal to the sum of a level of the write voltage, a level of a threshold voltage of the second switching unit, and a level of a threshold voltage of the selecting element.

4. The electronic device of claim 1, wherein the first switching unit comprises one or more first transistors serially coupled to and disposed between the first access part of the access circuit and the first end of the corresponding resistive memory cell, and
wherein the second switching unit comprises one or more second transistors serially coupled to and disposed between the second access part of the access circuit and the second end of the corresponding resistive memory cell.

5. The electronic device of claim 2, wherein the variable resistance element is switched to the low resistance state when the write voltage is applied thereto in the first direction, and switched to the high resistance state when the write voltage is applied thereto in the second direction opposite to the first direction.

6. The electronic device of claim 2, wherein the second voltage has a level equal to or higher than the sum of a reset level, a level of a threshold voltage of the second switching unit, and a level of a threshold voltage of the selecting element,
wherein the reset level corresponds to a minimum level required for switching the variable resistance element to the high resistance state.

7. The electronic device of claim 1, wherein the access circuit applies a read voltage across the selected resistive memory cell in the first direction during a read operation.

8. The electronic device of claim 7, wherein the first and second switching units corresponding to the selected resistive memory cell are turned on in response to the first voltage during the read operation.

9. The electronic device of claim 1, wherein, when the write voltage is applied across the selected resistive memory cell in the first direction, the first access part of the access circuit applies the write voltage to a first end of the selected resistive memory cell and the second access part of the access circuit applies a ground voltage to a second end of the selected resistive memory cell, and wherein, when the write voltage is applied across the selected resistive memory cell in the second direction, the second access part of the access circuit applies the write voltage to the second end of the selected resistive memory cell and the first access part of the access circuit applies the ground voltage to the first end of the selected resistive memory cell.

10. The electronic device according to claim 1, further comprising a microprocessor which includes:

a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

11. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

12. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

13. The electronic device according to claim 1, further comprising a data storage system which includes:

a storage device configured to store data and conserve stored data regardless of power supply;

a controller configured to control input and output of data to and from the storage device according to a command inputted from an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

14. The electronic device according to claim 1, further comprising a memory system which includes:

a memory configured to store data and conserve stored data regardless of power supply;

a memory controller configured to control input and output of data to and from the memory according to a command inputted from an outside;

a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

15. An electronic device comprising a semiconductor memory unit, wherein the semiconductor memory unit comprises:

a cell array comprising a plurality of resistive memory cells arranged at intersections of a plurality of columns and a plurality of rows;

an access circuit suitable for applying, during a write operation, a write voltage to a selected column among the plurality of columns and applying, during the write operation, a ground voltage to a selected row among the plurality of rows, or applying, during the write operation, the ground voltage to the selected column and applying the write voltage to the selected row;

a column selection circuit comprising a plurality of first switching units, each of the plurality of first switching units being coupled to and disposed between the access circuit and a corresponding column among the plurality of columns and turned on in response to a first voltage when the corresponding column is selected during the write operation; and a row selection circuit comprising a plurality of second switching units, each of the plurality of second switching units being coupled to and disposed between the access circuit and a corresponding row among the plurality of rows and turned on in response to a second voltage when the corresponding row is selected during the write operation.

16. The electronic device of claim 15, wherein the first voltage has a level that is higher than a predetermined level, and the second voltage has a level that is equal to or lower than the predetermined level.

17. The electronic device of claim 16, wherein each of the plurality of the resistive memory cells comprises:

a variable resistance element having a high resistance state or low resistance state according to a logic value of data stored therein; and a selecting element coupled in series to the variable resistance element.

18. The electronic device of claim 17, wherein the predetermined level corresponds to a full-turn-on level that is equal to the sum of a level of the write voltage, a level of a threshold voltage of the second switching unit, and a level of a threshold voltage of the selecting element.

19. The electronic device of claim 15, wherein each of the first switching units comprises one or more first transistors serially coupled to and disposed between the access circuit and a first end of a corresponding resistive memory cell, and
wherein each of the second switching units comprises one or more second transistors serially coupled to and disposed between the access circuit and a second end of the corresponding resistive memory cell.

20. The electronic device of claim 19, wherein the variable resistance element is switched to the low resistance state when the write voltage is applied to the corresponding column among the plurality of columns and the ground voltage is applied to the corresponding row among the plurality of rows, and switched to the high resistance state when the ground voltage is applied to the corresponding column and the write voltage is applied to the corresponding row.

21. The electronic device of claim 17, wherein the second voltage has a level equal to or higher than the sum of a reset level, a level of a threshold voltage of the second switching unit, and a level of a threshold voltage of the selecting element,
wherein the reset level corresponds to a minimum level required for switching the variable resistance element to the high resistance state.

22. The electronic device of claim 15, wherein the access circuit applies a read voltage to the selected column and applies the ground voltage to the selected row during a read operation.

23. The electronic device of claim 22, wherein the first switching unit corresponding to the selected column and the second switching unit corresponding to the selected row are turned on in response to the first voltage during the read operation.

24. The electronic device of claim 15, wherein each of the plurality of first switching units comprises one or more first switching transistors coupled in series,
each of the plurality of second switching units comprises one or more second switching units coupled in series,
the first voltage controls the one or more first switching transistors to operate in a linear region, and
the second voltage controls the one or more second switching units to operate in the linear region when a variable resistance element included in a corresponding resistive memory cell is in a low resistance state, and controls the one or more second switching units to operate in a saturation region when the variable resistance element included in the corresponding resistive memory cell is in a high resistance state.

25. The electronic device according to claim 15, further comprising a microprocessor which includes:
a control unit that is configured to receive a signal including a command from an outside of the microprocessor, and performs extracting, decoding of the command, or controlling input or output of a signal of microprocessor; and
an operation unit configured to perform an operation based on a result that the control unit decodes the command; and a memory unit configured to store data for performing the operation, data corresponding to a result of performing the operation, or an address of data for which the operation is performed,
wherein the semiconductor memory unit that includes the variable resistance element is part of the memory unit in the microprocessor.

26. The electronic device according to claim 15, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the variable resistance element is part of the cache memory unit in the processor.

27. The electronic device according to claim 15, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit that includes the variable resistance element is part of the auxiliary memory device or the main memory device in the processing system.

28. The electronic device according to claim 15, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the variable resistance element is part of the storage device or the temporary storage device in the data storage system.

29. The electronic device according to claim 15, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

30. An electronic device comprising a semiconductor memory unit, wherein the semiconductor memory unit comprises:

resistive memory cells;

an access circuit suitable for applying, during a write operation, a write voltage across a selected resistive memory cell among the resistive memory cells in a first or second direction;

first switching units, each of which is coupled to and disposed between the access circuit and a first end of a corresponding resistive memory cell among the resistive memory cells and turned on in response to a first voltage; and second switching units, each of which is coupled to and disposed between the access circuit and a second end of the corresponding resistive memory cell among the resistive memory cells and turned on in response to a second voltage, wherein the first voltage and the second voltage are different from each other.

31. The electronic device of claim 30, wherein each of the resistive memory cells comprises:

a variable resistance element having a high resistance state or low resistance state according to a logic value of data stored therein; and a selecting element coupled in series to the variable resistance element, and wherein the first voltage has a level higher than a predetermined level when the corresponding resistive memory cell is selected during the write operation, and the predetermined level corresponds to a full-turn-on level that is equal to the sum of a level of the write voltage, a level of a threshold voltage of the second switching unit, and a level of a threshold voltage of the selecting element.

32. The electronic device of claim 30, wherein each of the resistive memory cells comprises:

a variable resistance element having a high resistance state or low resistance state according to a logic value of data stored therein; and a selecting element coupled in series to the variable resistance element, wherein the second voltage has a level equal to or lower than the predetermined level when the corresponding resistive memory cell is selected during the write operation, wherein the second voltage has a level equal to or higher than the sum of a reset level, a level of a threshold voltage of the second switching unit, and a level of a threshold voltage of the selecting element, and wherein the reset level corresponds to a minimum level required for switching the variable resistance element to a high resistance state.

\* \* \* \* \*